United States Patent [19]

Oki et al.

[11] Patent Number: 5,462,900
[45] Date of Patent: Oct. 31, 1995

[54] METHOD OF MANUFACTURING SEMICONDUCTOR ELEMENTS WITHOUT BURRS

[75] Inventors: Tetsuro Oki; Koichiro Harada; Ryuichi Neki; Kazuo Kawakami, all of Okayama; Tsuyoshi Miyata; Kozo Matsuo, both of Kyoto, all of Japan

[73] Assignee: Rohm Co., Ltd., Kyoto, Japan

[21] Appl. No.: 125,547

[22] Filed: Sep. 23, 1993

[30] Foreign Application Priority Data

Mar. 15, 1993 [JP] Japan .................................. 5-053318

[51] Int. Cl.⁶ .................................................. H01L 21/463
[52] U.S. Cl. ................... 437/249; 437/906; 148/DIG. 28
[58] Field of Search ............................ 437/249; 209/315, 209/331, 332

[56] References Cited

U.S. PATENT DOCUMENTS 3,481,468  12/1969  Tonjes ...................................... 209/315
4,107,035  8/1978  Foresman ................................. 209/332
4,316,765  2/1982  Thiel ........................................ 156/636

FOREIGN PATENT DOCUMENTS 33851  4/1981  Japan .

OTHER PUBLICATIONS

Translation of JP-33851.

*Primary Examiner*—Brian E. Hearn
*Assistant Examiner*—Leon Radomsky
*Attorney, Agent, or Firm*—Brumbaugh, Graves Donohue & Raymond

[57] ABSTRACT

A method of manufacturing semiconductor elements with metal electrode films formed thereon in which the elements are spread on a metal screen having a mesh size small enough to prohibit the semiconductor elements from passing through it. The metal screen with the semiconductor elements on it is moved cyclically with a periodic motion substantially in a horizontal plane. As a result, burrs extending from the metal electrodes of the semiconductor elements are cut away or bent against the electrode surfaces of the semiconductor elements. The cyclic motion of the screen may be performed by tracing a figure-8 path.

15 Claims, 5 Drawing Sheets

METHOD OF MANUFACTURING SEMICONDUCTOR ELEMENTS WITHOUT BURRS

BACKGROUND OF THE INVENTION

This invention relates to methods for manufacturing pellet-like semiconductor elements, such as diodes, transistors and ICs, that are formed by dicing a wafer with metal electrode films formed on the wafer surfaces. More particularly, the invention relates to methods for manufacturing semiconductor elements in which burrs projecting from the metal electrode films which are produced by the dicing process are removed from the outer surfaces of the semiconductor elements.

FIG. 11 shows schematically the general arrangement of a mesa semiconductor diode which is one type of semiconductor element. As is well known, this diode has a p-type layer 1b which is formed by diffusing boron into the surface of one of the major sides of a silicon body 1 having, for example, an n-type layer 1a, and it includes metal electrode films 2 and 3 formed on the major sides of the body 1, respectively.

FIG. 12 shows a silicon wafer 1A used to produce the semiconductor element 1 in which a p-type layer is formed on one of the major sides of the silicon wafer. Further, the wafer has metal electrode films 2A and 3A on opposite sides which are formed by a vapor deposition process, for example.

FIG. 13 shows a process for manufacturing a number of diodes D from the silicon wafer 1A. As shown in FIG. 13, the major side of the silicon wafer 1A having the metal electrode film 3A is equidistantly grooved in the vertical and horizontal directions by an etching process. This produces equidistantly spaced sets of perpendicular grooves 4 which define a number of square pieces, each including a portion 3 of the metal electrode film 3A. The grooved silicon wafer 1A, including the metal electrode film 2A, is then diced along the grooves 4 by a diamond cutter 5, for example, to form a number of square pieces, or semiconductor diodes D, each having a substrate 1 sandwiched between metal electrode films 2 and 3.

Silver (Ag) has been used widely for electrodes for this type of semiconductor element, i.e., for the metal electrode films 2 and 3 of the diodes D in the illustrated example. Silver not only has excellent electrical conductivity, but also has good malleability and ductility. Because of its good malleability and ductility, silver functions advantageously in that it is easy to work in the manufacture of semiconductor elements. However, because of its good ductility, the portions of the metal electrode film 2A which are cut by the diamond cutter 5 in the wafer dicing process project away from the element as burrs a.

The length of the burrs a produced in the wafer dicing process depends on the thickness of the silver electrode film 2A. For example, it has been experimentally determined that, for an electrode film 2A 6 to 10 μm thick, the burrs a formed by the dicing process were 10 to 80 μm long.

To assemble such semiconductor elements into electronic parts, an assembling jig 8, shown in FIG. 14, is usually used. The jig 8 is constructed with a recess 6 in which a semiconductor element, i.e., the diode D in this example, is to be set against a surface 6a and includes a suction hole 7 which opens into the recess 6. When a diode D with a burr a projecting from the metal electrode film 2A is set in the recess 6, the diode D is tilted because the burr is brought into contact with the surface 6a of the recess 6 as shown.

In the suction step, a vacuum pump, not shown, draws air through the suction hole 7 to pull the diode D against the surface 6a. However, because the burr a holds the diode D tilted in the recess 6 leaving a gap, the bottom surface of the metal electrode film 2A of the diode is not drawn against the surface 6a. This makes it difficult to assemble the semiconductor elements.

To overcome the problem produced by the burr a, the prior art, so far as we know, has (1) made the silver electrode film 2A as thin as possible, thereby forming a burr of the smallest possible height from the electrode surface, and (2) used an electrode film 2A of normal thickness and etched away the burr formed after dicing by an etching solution of aluminum nitrate, for example.

The first measure succeeds in reducing the height of the burr since the electrode film 2A of the wafer 1A is reduced in thickness. However, this measure does not avoid the problem of loose contact because, when the electrode film 2A is soldered to a lead (not shown) during assembly of the diode D, silver from the electrode film is also partially softened or melted away by heat from the solder.

The second measure for removing the burr by an etching process also tends to suffer from the loose contact problem because the etching solution may reach the electrode film 2A so as to corrode the silver in the electrode film as well as reducing the burr a.

SUMMARY OF THE INVENTION

Accordingly, it is an object of the present invention to provide a method for manufacturing semiconductor elements which overcomes the above-mentioned problems occurring during the manufacture of semiconductor elements without degrading a metal electrode film formed on the element body.

This and other objects of the invention are attained by providing a method of manufacturing semiconductor elements including the step of moving diced semiconductor elements having burrs extending from metal electrode films formed thereon over a metal screen having opening sizes such as to prohibit the semiconductor elements from passing through the screen. Further, the metal screen bearing the semiconductor elements thereon is moved cyclically in a periodic motion substantially in a horizontal plane, whereby the burrs extending from the metal electrodes of the semiconductor elements are cut away or bent against the bottom surfaces of the semiconductor elements. The cyclic motion of the screen may be performed by tracing a figure-8 path.

In the method mentioned above, the screen may be supported in a tubular holder and the screen size is selected so as to prevent the individual semiconductor elements from passing through it.

Alternatively, the screen device includes a tubular holder having a bottom screen with openings small enough to prevent the individual semiconductor elements from passing through them, and a second holder above the first holder having a screen with openings large enough to allow the individual semiconductor elements to pass through them.

In these methods, semiconductor elements are spread over the metal screen and the metal screen is cyclically moved in a periodic motion along a figure-8 path substantially in a horizontal plane so that the semiconductor elements slide and rotate on the screen. With the figure-8-shaped cyclic motion of the screen, burrs protruding from the metal electrode films of the semiconductor elements slide against the screen so as to be separated from the metal electrode films or bent against the bottom surfaces of the semiconductor elements. The burrs separated from the metal electrode films then drop through the openings of the screen. Accordingly, the semiconductor elements, after being processed in this way for burr removal, have no high burrs so that those elements can be seated stably against the surface of the recess in the jig when they are assembled, thereby assuring reliable assembly of the semiconductor elements.

BRIEF DESCRIPTION OF THE DRAWINGS

Further objects, advantages and features of the present invention will be apparent from a reading of the following detailed description with reference to the accompanying drawings, in which.

DESCRIPTION OF PREFERRED EMBODIMENTS

Figure 1:
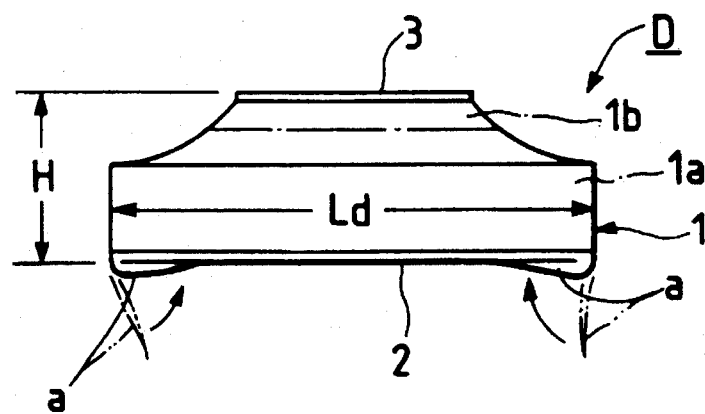
FIG. 1 is an enlarged side view showing a diode rectifier made in accordance with the semiconductor element manufacturing method of the present invention.
Figure 13:
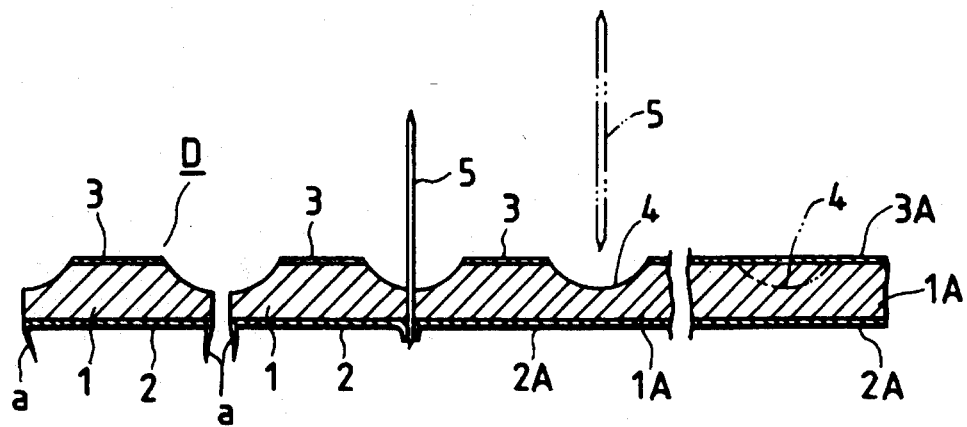
FIG. 13 is a cross-sectional view schematically showing a dicing process for dicing the wafer of FIG. 12.

In the representative embodiment of the invention shown in FIGS. 1–5, reduction of burrs formed by dicing on the metal electrode films such as the mesa semiconductor diodes D as semiconductor elements shown in FIG. 1 is accomplished. The diode D, like the conventional diode already described, has a pellet-like structure in which a p-type layer $1b$ is formed by diffusing boron into the surface region of one of the major sides of a semiconductor element body 1 made of silicon having, for example, an n-type layer $1a$ and having metal electrode films 2 and 3 made primarily of silver formed on the major sides of the element body 1, respectively. Diodes having this structure are formed by dicing a silicon wafer in an manner similar to that described above with respect to FIG. 13. Immediately after the dicing process, high burrs a extend from the edges of the metal electrode film 2 on the bottom of each diode, as indicated by a phantom line in FIG. 1. The burrs a are formed when the metal electrode film 2 is diced, as stated above. Since the dicing process is conventional, no further description will be given for simplicity.

Figure 2:
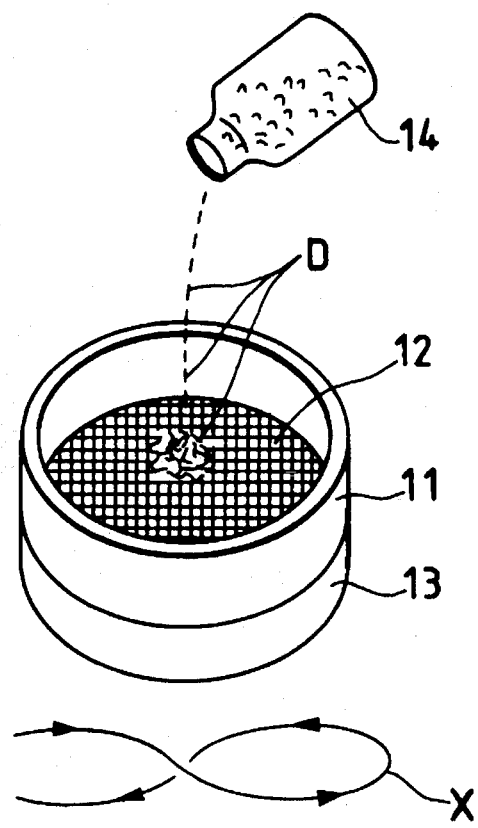
FIG. 2 is a perspective view schematically showing a screen arrangement and a container holding a number of diodes for use in burr removal in the process for manufacturing semiconductor elements according to a first representative embodiment of the present invention.
Figure 3:
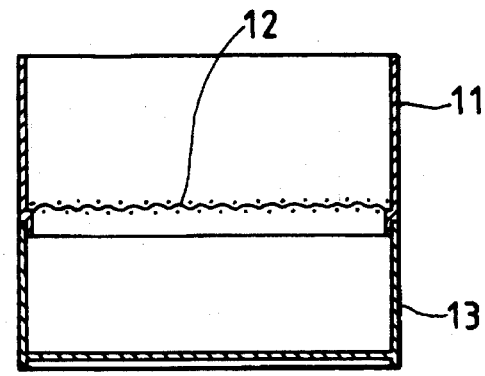
FIG. 3 is an enlarged longitudinal sectional view illustrating the screen arrangement shown in FIG. 2.

FIG. 2 is a perspective view schematically showing an arrangement used to carry out the first representative embodiment of the manufacturing method according to the present invention. In this instance, the arrangement is in the form of a screen. FIG. 3 is an enlarged longitudinal sectional view illustrating the screen arrangement shown in FIG. 2. In the screen arrangement shown in these drawings, a tubular holder 11 has a bottom screen 12 and a receptacle 13 also having a tubular shape with a diameter substantially equal to that of the tubular holder 11 and having a closed bottom. The tubular holder 11 is removably received in the open top of the receptacle 13.

Figure 4:
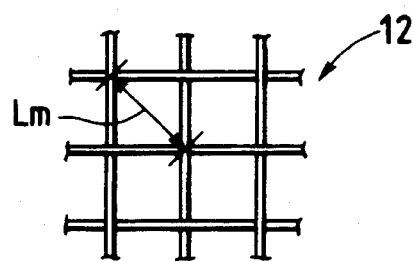
FIG. 4 is an enlarged plan view showing a part of a screen used in the screen arrangement shown in FIG. 2.

FIG. 4 is an enlarged plan view showing a part of the screen 12 used in the holder 11 shown in FIG. 2. As shown, the screen 12 is formed by metal wires woven into a lattice structure in which the screen opening size is selected so as to prevent individual diodes D from passing through the screen. In this embodiment, the length Lm of the diagonal of each screen opening is smaller than the length Ld of the longest side of the diode D, i.e., Lm<Ld.

The screen 12 is preferably made of stainless steel. In this embodiment, the metal wires are interwoven into a lattice-like structure having a number of square open spaces, but the wires may also be interwoven into a structure having a number of triangular open spaces or hexagonal open spaces, for example. In each case, those open spaces must have such a maximum size small enough to prevent the diodes D from passing through the screen.

To carry out the manufacturing method of this embodiment, as shown in FIG. 2, the tubular holder 11 is inserted into the receptacle 13 and an appropriate number of diodes D is poured into the holder 11 from a container 14 and they are arranged so that they are distributed on the screen 12 in the holder 11.

Subsequently, the combination of the holder 11 containing the diodes D arranged on the bottom screen 12 and the receptacle 13, referred to as a screen arrangement, is cyclically moved with a periodic motion in a horizontal plane along a path which is shaped like the FIG. 8. The periodic motion in the horizontal plane following the figure-8-shaped path causes the individual diodes D to slide and rotate substantially uniformly on the screen 12, thereby effectively reducing the height of the burrs a on the diodes.

During this horizontal cyclical motion, the diodes D move across the screen 12 within the holder 11. When moving on the screen 12, the diodes D slide on the perpendicularly intersecting metal wires of the screen 12 so that the burrs a extending from the side edges of the electrode films 2 of the diodes D are partially cut off and drop through the screen into the receptacle 13, while the burrs a remaining attached to the side edges of the diodes are bent against the bottom surfaces of the diodes D as shown in FIG. 1.

An experiment has shown that, when the screen arrangement was manually moved in a periodic motion with a period of one second along the figure-8-shaped path for at least 10 minutes, the portion of the burrs a of the diodes which were not cut off were bent against the bottom surfaces of the diodes. For the cyclical motion of the screen arrangement, an automatic machine which holds the screen arrangement and moves it cyclically along the figure-8-shaped path at preset periods may be used, although it was moved manually in the experiment.

Figure 5:
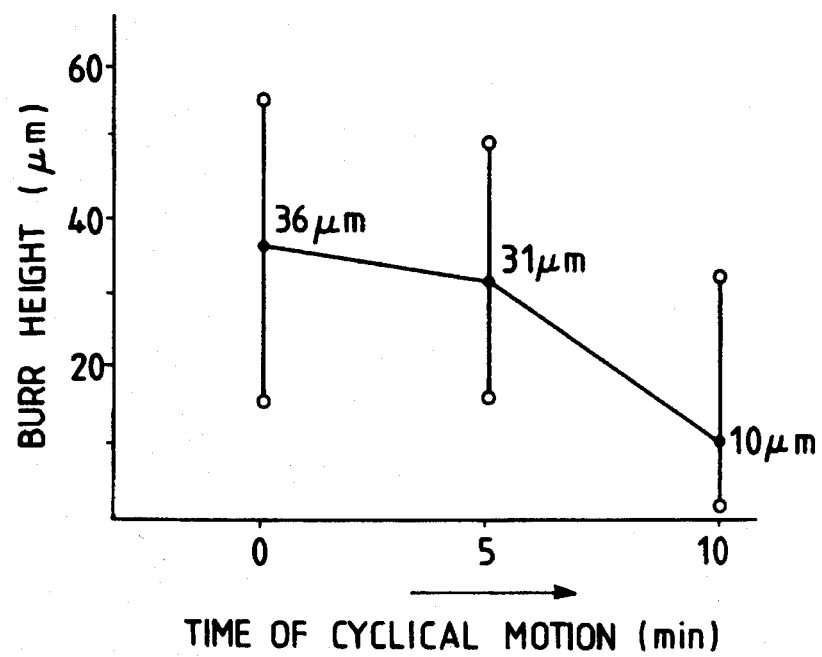
FIG. 5 is a graphical representation showing the reduction in burr height with respect to the duration of cyclical motion in an experiment carried out in accordance with the first embodiment of the invention.

FIG. 5 is a graph showing the reduction in burr height with respect to duration of cyclical motion as the result of an experiment according to the first embodiment. In that experiment, the diodes D used as test pieces each had a length Ld along one side of 1.24 mm and a height H of 0.24 mm. The screen holder 11 was 200 mm in diameter, and the screen 12 had a mesh of #40, i.e., the diagonal length Lm was 0.72 mm.

During the experiment, 50,000 diodes D having burrs with an average height of 36 μm which were diced from wafers and put into the screen holder 11 for the burr-removal process. The holder 11 containing these diodes was moved in a cyclical motion having a period of one second for 5- and 10-minute periods. After the 5-minute period of cyclic motion, the diodes had burrs with an average height of 31 μm and, after 10 minutes of such motion, they had burrs with an average height of 10 μm. Thus, average burr height after 10 minutes of cyclic motion is approximately one-third the original height of the burrs after 5 minutes of motion.

The reduction of the maximum height of the burrs with increased duration of the cyclic motion was even more remarkable. A large percentage of the diodes D had negligible burr height such as shown in FIG. 1. From this fact, it can be anticipated that the burr height in all diodes could be reduced to negligible values when the diodes are subjected to a cyclic motion of 10 minutes or more. A diode D having burrs a which have been reduced in height to the degree shown in FIG. 1, when set in the guide recess 6 of the jig 8, has a metal electrode film 2 with a surface flat enough so that it engages the surface 6a of the guide recess 6 substantially uniformly. Thus, the problem caused by a gap between the diode bottom and the surface 6a during assembly of the diode has been overcome. The success in solving this problem according to the invention provides the additional beneficial effect of eliminating loose contacts because there is no need to thin the metal electrode film 2 of the diode D by etching away the burrs. Therefore, there are neither partially thinned portions nor partially cut-away portions of the metal electrode film 2 of a diode prepared according to the invention.

A method of manufacturing semiconductor elements according to a second embodiment of the present invention will be described hereinafter with reference to FIGS. 6–10.

Figure 6:
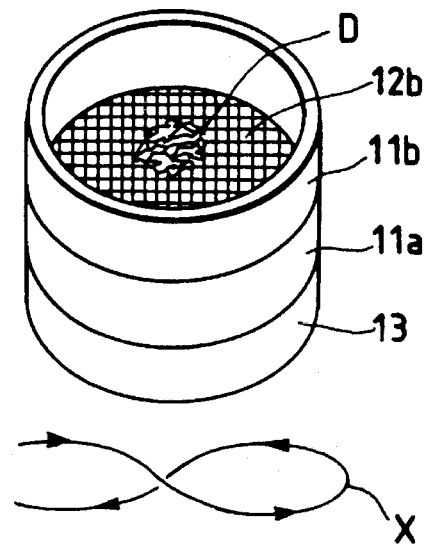
FIG. 6 is a perspective view schematically showing a screen arrangement for use in burr removal in the process for manufacturing semiconductor elements according to a second representative embodiment of the present invention.
Figure 7:
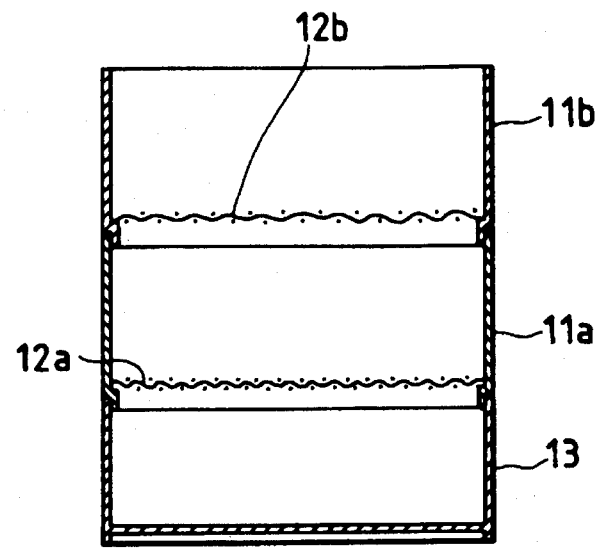
FIG. 7 is an enlarged longitudinal sectional view showing the screen arrangement shown in FIG. 6.

FIG. 6 is a perspective view schematically showing a screen arrangement used for burr removal in a process of manufacturing semiconductor elements according to a second embodiment of the present invention. FIG. 7 is an enlarged longitudinal sectional view showing the screen arrangement illustrated in FIG. 6.

Figure 8A:
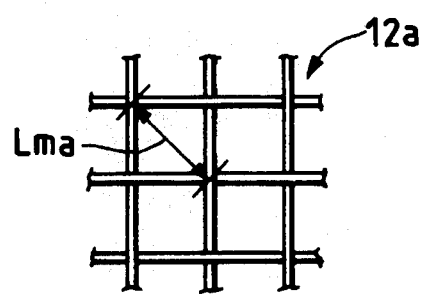
FIG. 8(A) is an enlarged plan view showing a part of the lower screen used in the screen arrangement shown in FIG. 6.

As will be seen from the figures, the screen arrangement for carrying out the second embodiment of the invention consists of an upper holder 11b with a bottom screen 12b and a lower holder 11a with a bottom screen 12a. The upper holder 11b is mounted on the lower holder 11a and the mesh size of the screen 12b is different from that of the screen 12a. Like the screen 12 of the first embodiment, the screen 12a of the lower holder 11a, as shown in FIG. 8(A), is designed so that the diagonal length Lma of each opening in the screen 12a is smaller than the length Ld of the longest side of the diode D, i.e., the opening has a size small enough to prevent the diodes from passing through it.

Figure 8B:
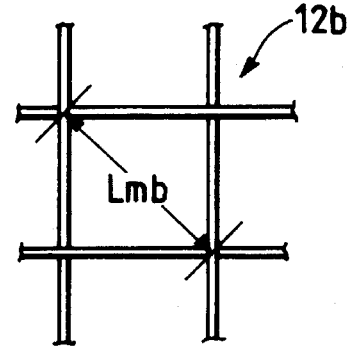
FIG. 8(B) is an enlarged plan view showing a part of the upper screen used in the screen arrangement of FIG. 6.

The screen 12b of the upper holder 11b, as shown in FIG. 8(B), has square openings with a diagonal length Lmb large enough to allow the diodes to pass through them. Thus, the diagonal lengths Lma and Lmb of the openings in the screens in the lower and upper holders 11a and 11b and the size of the diode D are related as follows: Lma<Ld<Lmb.

To carry out the manufacturing method of the second embodiment, as shown in FIG. 6, the lower holder 11a is mounted on the receptacle 13, and the upper holder 11b is mounted on the lower holder 11a, thereby forming a double screen assembly. Then an appropriate number of diodes D is poured into the upper holder 11b and arranged so that they are distributed on the screen 12b of the holder 11b.

Subsequently, the screen assembly consisting of the upper and lower holders 11b and 11a and the receptacle 13 is cyclically moved with a periodic motion in a horizontal plane along a path which is shaped like the FIG. 8. During the periodic motion in the figure-8-shaped path in the horizontal plane, the diodes D fall through the coarse screen 12b onto the screen 12a of the lower holder 11a. At this time, the burrs a of the diodes D engage with the metal wires of the screen 12b so as to bend the burrs inwardly against the bottom surface of the diodes. This facilitates the burr height reduction.

The diodes D, which are then spread on the screen 12a of the holder 11a, slide and rotate on the screen 12a. The burrs a extending from the edges of the electrode films 2 of the diodes D are partially cut off and drop through the screen into the receptacle 13, while the burrs a remaining at the side edges of the diodes are bent against the bottom surfaces of the diodes D.

Figure 9:
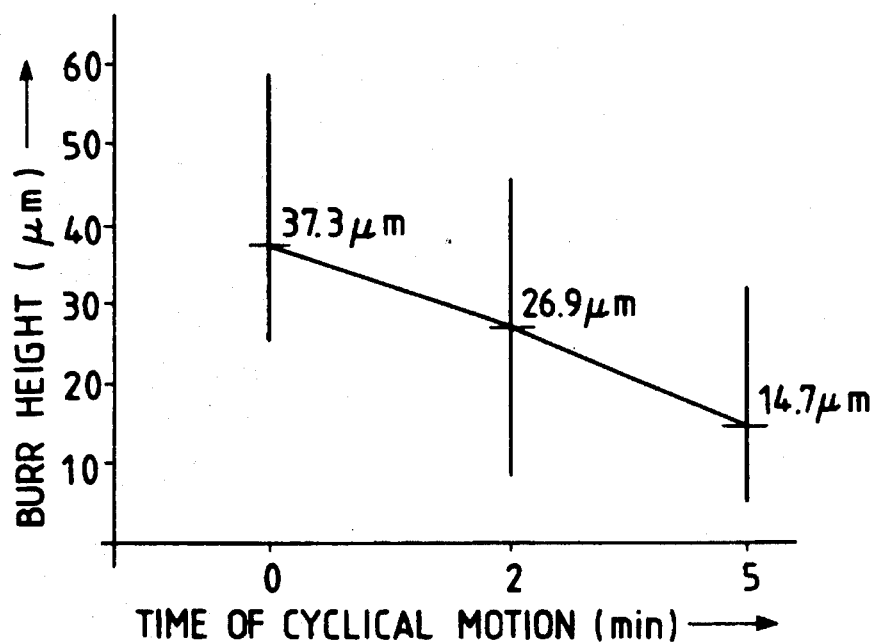
FIG. 9 is a graphical representation showing the reduction in burr height with respect to the duration of cyclical motion in an experiment carried out in accordance with the second embodiment of the invention.

FIG. 9 is a graph showing the reduction of burr height with respect to the duration of cyclical motion as the result of an experiment using the second embodiment. In that experiment, the diodes D used as test pieces had the same dimensional specifications as those of the diodes D used in the experiment discussed above in connection with the first embodiment. The diameter of each of the upper and lower holders 11b and 11a was 200 mm and the screen 12a of the lower holder 11a had a #40 mesh, i.e., the diagonal length Lma of the openings therein was 0.72 mm, while the screen 12b in the upper holder 11b had a #20 mesh, i.e., the diagonal length Lmb of the openings therein was 1.41 mm.

In this experiment, 50,000 diodes D diced from wafers and having burrs with an average height of 37.3 μm were put into the upper holder 11b for the burr-removal process. The holder 11b containing these diodes was moved in a cyclical motion having a period of one second, first for 2 minutes and then for 5 minutes. Diodes processed with the 2-minute cyclic motion had burrs with an average height of 26.9 μm, and diodes processed with the 5-minute cyclic motion had burrs with an average height of 14.7 μm.

Figure 14:
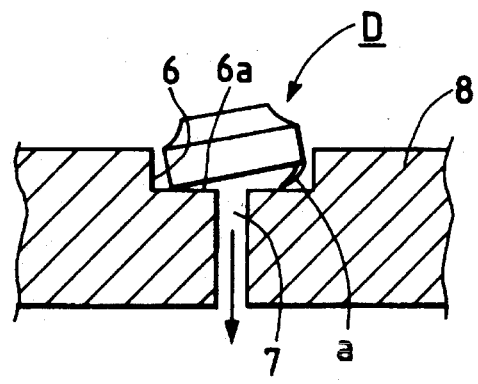
FIG. 14 is a cross-sectional view schematically showing a semiconductor element properly positioned in a conventional automatic assembling process.

Diodes D processed for burr removal by the manufacturing method of the second embodiment and diodes D which had not been processed were each set in the jig 8 shown in FIG. 14. The position of each diode D with respect to the surface 6a of the recess 6 was determined diode by diode. In the case of the diodes D which had not been processed, 100 diodes out of a total of 1,920 diodes were improperly positioned on the surface 6a. All of the diodes processed by the method of the second embodiment were properly positioned.

Figure 10:
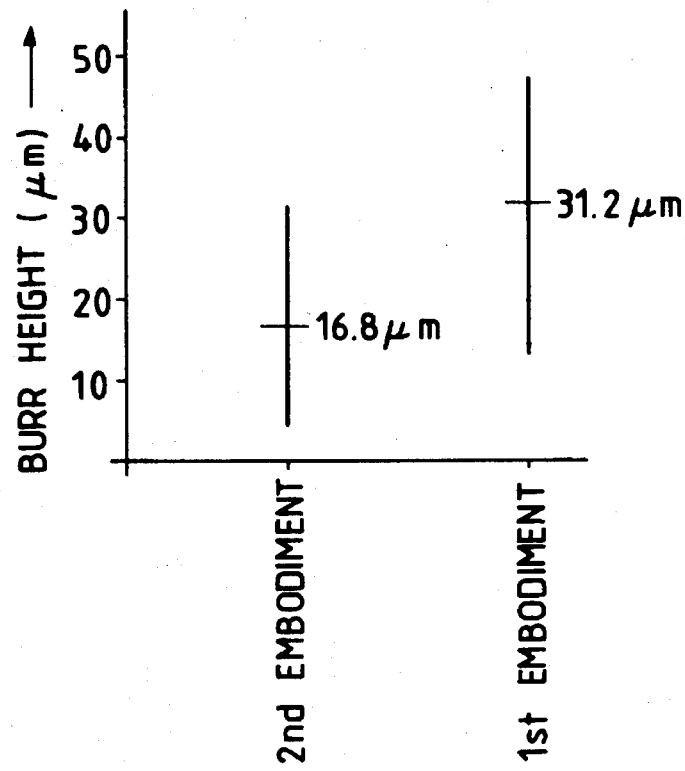
FIG. 10 is a graphical representation providing a comparison of the reductions in burr height in the experiments using the methods of the first and second embodiments.
Figure 11:
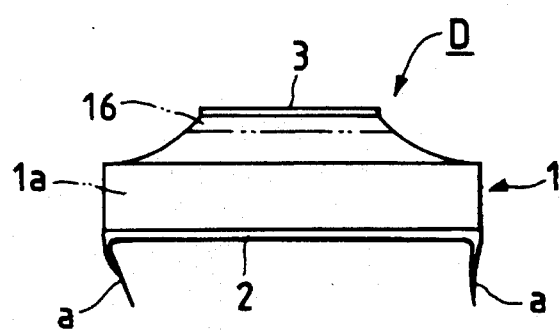
FIG. 11 is an enlarged side view showing the condition of a conventional diode rectifier immediately after the dicing step.
Figure 12:
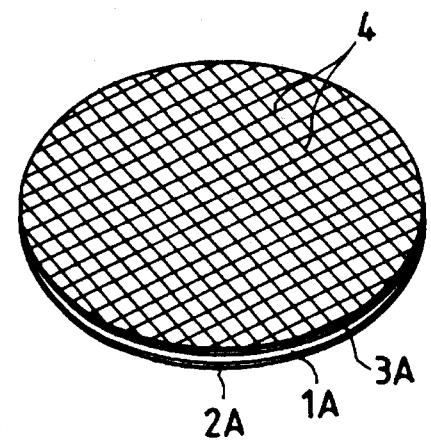
FIG. 12 is a perspective view showing a typical silicon wafer arranged as a source of diode rectifiers.

Test samples of the diodes having the same original burr structure were experimentally subjected to the burr removal process by the methods of the first and second embodiments. The results of the experiment are shown in FIG. 10. In the experiment, 10 test samples were used, and the cyclic motion duration was 5 minutes.

The graph in FIG. 10 demonstrates that the second embodiment is superior to the first embodiment in burr height reduction. As seen from FIG. 10, the test samples processed by the first embodiment using only the holder 11 having the screen 12 with openings which prevent the test pieces from passing through it had an average burr height of 31.2 μm. On the other hand, the test samples processed by the second embodiment using the upper holder 11b with the screen 12b having openings large enough to allow the test samples to pass through it and the lower holder 11a with the screen 12a having openings which prevent the test samples from passing through it had an average burr height of 16.8 μm. Thus, the graph of FIG. 10 demonstrates that the use of the screen 12a having a coarse mesh contributes greatly to the reduction in burr height.

The method for manufacturing semiconductor elements according to the present invention is useful for removal of burrs formed at the cut end faces of separated metal pieces used for the electrodes of semiconductor elements, for example, double heat sink diodes. In this case also, the burrs extending from the cut end faces can be substantially reduced or completely removed by the burr removal processes described above. The result is to eliminate dangerous short-circuiting between the electrodes of the parts after they are assembled. As seen from the foregoing description, pellet-like semiconductor elements are spread over a metal screen having a screen size small enough to prohibit the semiconductor elements from passing through it. The metal screen is then moved cyclically with a periodic motion along a path shaped like the figure 8 substantially in a horizontal plane so that the semiconductor elements slide and rotate on the screen. With the figure-8-shaped periodic motion of the screen, the burrs extending from the metal electrode films of the rotating semiconductor elements slide on the screen so as to be cut off and separated from the metal electrode films or else bent against the bottom surfaces of the semiconductor elements. Accordingly, burrs which have a significant height from the side edges of the metal electrode films of the diodes can be removed or bent so as to have negligible height.

Semiconductor elements processed according to the invention having silver electrode films, which are frequently used as the metal electrode films, when set in the assembly jig, are stably positioned on the surface of the recess so that the metal electrode film completely contacts the surface. The problem resulting from the unstable positioning of a semiconductor element on that surface during assembly of the semiconductor elements is therefore successfully overcome.

Further, there is no need to thin the metal electrode film of the diode by etching away the burrs. Accordingly, neither partially thinned portions nor partially cut-away portions are produced in the metal electrode film of the diode, thereby eliminating element failure caused by a loose contact. Thus, the relatively simple manufacturing method of the invention can completely eliminate the problems of the conventional methods. Additionally, the cut-away burrs are completely separated from the semiconductor elements by passing through the screen. Consequently, short-circuiting by residual burrs cannot occur.

Although the invention has been described herein with reference to specific embodiments, many modifications and variations therein will readily occur to those skilled in the art. Accordingly, all such variations and modifications are included within the intended scope of the invention.

We claim:

1. A method for manufacturing semiconductor elements comprising:

spreading semiconductor elements having ductile metal electrode films formed thereon over a screen arrangement having openings small enough to prohibit the semiconductor elements from passing through it, and cyclically moving the screen arrangement bearing the semiconductor elements thereon with a periodic motion substantially in a horizontal plane, whereby burrs extending downwardly from the metal electrode films of the semiconductor elements are cut away or bent toward the metal electrode films of the semiconductor elements.

2. A method according to claim 1 wherein the screen arrangement includes:

a tubular frame, a screen having openings small enough to prevent the semiconductor elements from passing through the screen, and a receptacle below the screen.

3. A method according to claim 2 wherein the screen openings have a shape selected from square, triangular and hexagonal.

4. A method according to claim 3 wherein the maximum dimension of the openings is smaller than the largest dimension of the semiconductor elements.

5. A method according to claim 1 wherein the periodic motion of the screen arrangement is a figure-8 motion.

6. A method according to claim 1 wherein the screen arrangement is a metal screen.

7. A method according to claim 6 wherein the metal screen is made of stainless steel.

8. A method for manufacturing semiconductor elements comprising:

spreading semiconductor elements having metal electrode films formed thereon over a screen arrangement having openings small enough to prohibit the semiconductor elements from passing through it, and cyclically moving the screen arrangement bearing the semiconductor elements thereon with periodic motion substantially in a horizontal plane, whereby burrs extending from the metal electrode films of the semiconductor elements are cut away or bent toward the metal electrode films of the semiconductor elements, wherein the screen arrangement includes, a tubular frame, an upper screen having openings large enough to allow the semiconductor elements to pass through it, and a lower screen having openings small enough to prevent the semiconductor elements from passing through it, and a receptacle beneath the lower screen.

9. A method according to claim 8 wherein the upper and lower screens each have a plurality of openings.

10. A method according to claim 9 wherein the openings have a shape selected from square, triangular and hexagonal.

11. A method according to claim 10 wherein the maximum size of the openings in the upper screen is greater than the largest dimension of the semiconductor elements.

12. A method according to claim 8 wherein the periodic motion of the screen arrangement consists of a figure-8 motion.

13. A method according to claim 8 wherein the upper and lower screens are made of metal.

14. A method according to claim 13 wherein the upper and lower screens are made of stainless steel.

15. A method according to claim 1 wherein the periodic motion extends in at least two transverse directions.

* * * * *

UNITED STATES PATENT AND TRADEMARK OFFICE
CERTIFICATE OF CORRECTION

PATENT NO. : 5,462,900

DATED : October 31, 1995

INVENTOR(S) : Tetsuro Oki et al.

It is certified that error appears in the above-indentified patent and that said Letters Patent is hereby corrected as shown below:

On title page, item [54] and col. 1, lines 1-2, change title to read --METHOD OF MANUFACTURING SEMICONDUCTOR ELEMENTS--;

Column 6, line 24: "FIG. 8" should read --figure 8--.

Signed and Sealed this

Nineteenth Day of March, 1996

Attest:

BRUCE LEHMAN

Attesting Officer       Commissioner of Patents and Trademarks